(12) United States Patent
Fang

(10) Patent No.: US 11,953,828 B2
(45) Date of Patent: Apr. 9, 2024

(54) METHOD OF MAKING A PICOSCOPIC SCALE/ NANOSCOPIC SCALE CIRCUIT PATTERN

(71) Applicant: LONGSERVING TECHNOLOGY CO., LTD, Taipei (TW)

(72) Inventor: Ko-Cheng Fang, Taipei (TW)

(73) Assignee: LONGSERVING TECHNOLOGY CO., LTD, Taipei (TW)

( * ) Notice: Subject to any disclaimer, the term of this patent is extended or adjusted under 35 U.S.C. 154(b) by 637 days.

(21) Appl. No.: 17/171,854

(22) Filed: Feb. 9, 2021

(65) Prior Publication Data

US 2022/0229363 A1 Jul. 21, 2022

(30) Foreign Application Priority Data

Jan. 18, 2021 (TW) ................. 110101810

(51) Int. Cl.
| | | |
|---|---|---|
| *G03F 7/004* | (2006.01) | |
| *G03F 7/20* | (2006.01) | |
| *G03F 7/32* | (2006.01) | |
| *H01L 21/027* | (2006.01) | |

(52) U.S. Cl.
CPC .......... *G03F 7/0043* (2013.01); *G03F 7/2006* (2013.01); *G03F 7/325* (2013.01); *H01L 21/0275* (2013.01)

(58) Field of Classification Search
CPC .... G03F 7/0042; G03F 7/0043; G03F 7/0047; G03F 7/2014
See application file for complete search history.

(56) References Cited

U.S. PATENT DOCUMENTS 3,960,560 A * 6/1976 Sato .................... G03F 1/50
430/512
4,350,755 A * 9/1982 Wang ................ G03F 7/2039
430/323

FOREIGN PATENT DOCUMENTS

| JP | 7-301913 A | 11/1995 |
| JP | 2002-517785 A | 6/2002 |
| JP | 2009-26933 A | 2/2009 |
| JP | 2010-66350 A | 3/2010 |
| JP | 2013-58645 A | 3/2013 |
| JP | 2014-174269 A | 9/2014 |
| JP | 2019-106305 A | 6/2019 |
| KR | 10-2009-0030732 A | 3/2009 |
| KR | 10-2009-0089561 A | 8/2009 |
| KR | 10-2016-0111317 A | 9/2016 |
| WO | WO 2019/093245 A1 | 5/2019 |

* cited by examiner

*Primary Examiner* — Daborah Chacko-Davis
(74) *Attorney, Agent, or Firm* — Birch, Stewart, Kolasch & Birch, LLP

(57) ABSTRACT

Provided is a method of making a circuit pattern. The method includes: Step (A): providing a master substrate comprising a first photosensitive layer containing photosensitive particles; Step (B): providing an energy beam to reduce metal ions in a predetermined area of the first photosensitive layer to form multiple first metal particles; Step (C): removing unreduced photosensitive particles by a fixer to obtain a master mask; wherein the first metal particles form a first predetermined pattern in the master mask; Step (D): providing a chip comprising a second photosensitive layer containing second photosensitive particles; Step (E): putting the master mask on the second photosensitive layer and providing an energy beam to reduce metal ions of an uncovered part of the second photosensitive layer to form multiple atomized second metal particles; Step (F): removing unreduced photosensitive particles by a fixer to obtain the circuit pattern having line spacing at picoscopic/nanoscopic scale.

16 Claims, 2 Drawing Sheets

```
┌─────────────────────────────────────────────────┐
│ PROVIDING A MASTER SUBSTRATE WHICH COMPRISES A  │
│ TRANSPARENT SUBSTRATE AND A FIRST PHOTOSENSITIVE│
│   LAYER FORMED ON THE TRANSPARENT SUBSTRATE;    │
│   WHEREIN THE FIRST PHOTOSENSITIVE LAYER INCLUDES│
│      MULTIPLE PHOTOSENSITIVE PARTICLES; THE     │
│         PHOTOSENSITIVE PARTICLES OF THE FIRST   │
│  PHOTOSENSITIVE LAYER COMPRISE A FIRST METAL SALT│
│         CONTAINING FIRST METAL IONS;            │
│  WHEREIN THE FIRST METAL IONS COMPRISE SILVER IONS│
│              OR CHROMIUM IONS                   │
└─────────────────────────────────────────────────┘
                         │
                         ▼
┌─────────────────────────────────────────────────┐
│   PROVIDING A FIRST ENERGY BEAM TO IRRADIATE THE│
│   FIRST PHOTOSENSITIVE LAYER TO REDUCE THE FIRST│
│ METAL IONS THAT ARE IN A PREDETERMINED AREA OF THE│
│  FIRST PHOTOSENSITIVE LAYER, SO AS TO FORM MULTIPLE│
│        ATOMIZED FIRST METAL PARTICLES;          │
│    WHEREIN THE FIRST ENERGY BEAM HAS A WAVELENGTH│
│            RANGING FROM 1 PM TO 200 NM          │
└─────────────────────────────────────────────────┘
                         │
                         ▼
┌─────────────────────────────────────────────────┐
│   REMOVING UNREDUCED PHOTOSENSITIVE PARTICLES OF│
│   THE FIRST PHOTOSENSITIVE LAYER BY A FIRST FIXER TO│
│             OBTAIN A MASTER MASK;               │
│  WHEREIN THE ATOMIZED FIRST METAL PARTICLES FORM A│
│  FIRST PREDETERMINED PATTERN ON THE MASTER MASK │
└─────────────────────────────────────────────────┘
                         │
                         ▼
                        (A)
```

FIG.1A

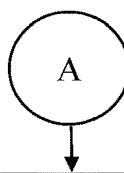

```
PROVIDING A CHIP WHICH COMPRISES A SEMICONDUCTOR
SUBSTRATE AND A SECOND PHOTOSENSITIVE LAYER
FORMED ON THE SEMICONDUCTOR SUBSTRATE; WHEREIN
THE SECOND PHOTOSENSITIVE LAYER INCLUDES
MULTIPLE PHOTOSENSITIVE PARTICLES; THE
PHOTOSENSITIVE PARTICLES OF THE SECOND
PHOTOSENSITIVE LAYER COMPRISE A SECOND METAL
SALT CONTAINING SECOND METAL IONS, WHEREIN THE
SECOND METAL IONS COMPRISE SILVER IONS OR
CHROMIUM IONS
```

```
DISPOSING THE MASTER MASK ON THE SECOND
PHOTOSENSITIVE LAYER TO FORM A COMPLEX LAYER, AND
THEN PROVIDING A SECOND ENERGY BEAM TO IRRADIATE
THE COMPLEX LAYER TO REDUCE THE SECOND METAL
IONS THAT ARE IN AN AREA OF THE SECOND
PHOTOSENSITIVE LAYER WHICH IS NOT COVERED BY THE
FIRST PREDETERMINED PATTERN OF THE MASTER MASK,
SO AS TO FORM MULTIPLE ATOMIZED SECOND METAL
PARTICLES;
WHEREIN THE SECOND ENERGY BEAM HAS A
WAVELENGTH RANGING FROM 1 PM TO 200 NM
```

```
REMOVING UNREDUCED PHOTOSENSITIVE PARTICLES OF
THE SECOND PHOTOSENSITIVE LAYER BY A SECOND FIXER
TO OBTAIN THE CIRCUIT PATTERN; WHEREIN THE CIRCUIT
PATTERN HAS A SECOND PREDETERMINED PATTERN
FORMED BY THE ATOMIZED SECOND METAL PARTICLES;
WHEREIN THE SECOND PREDETERMINED PATTERN IS A
NEGATIVE IMAGE OF THE FIRST PREDETERMINED
PATTERN, AND A LINE SPACING IN THE CIRCUIT PATTERN
RANGES FROM 1 PM TO 100 NM
```

FIG.1B

METHOD OF MAKING A PICOSCOPIC SCALE/ NANOSCOPIC SCALE CIRCUIT PATTERN

CROSS-REFERENCE TO RELATED APPLICATION

Pursuant to 35 U.S.C. § 119(a), this application claims the benefit of the priority to Taiwan Patent Application No. 110101810, filed on Jan. 18, 2021. The content of the prior application is incorporated herein by its entirety.

BACKGROUND OF THE INVENTION

1. Field of the Invention

The present disclosure relates to a method of making a circuit pattern, and more particular to a method of making a fine circuit pattern for integrated circuits.

2. Description of the Prior Arts

For nearly 6 decades, the invention of chips composed of semiconductor integrated circuits (ICs) has driven the global technological development in leaps and bounds and has hugely changed human life. With the increasing demand for small, lightweight and high-performing electronic and electrical products, the functional density of ICs needs to be generally increased while the geometric size of ICs needs to be generally decreased. Such scaling down process not only increases the complexity of manufacturing process of ICs, but also substantially increases the difficulty of the process and overall production costs.

Lithography machine has been the key equipment for manufacturing chips. For example, a conventional and main optical lithography uses argon fluoride laser (ArF laser) having a wavelength of 193 nm, and it can support IC chip fabrication with feature size of from 45 nm to 7 nm. However, the conventional optical lithography is approaching its technological and economic limit, and ArF laser cannot support the IC chip fabrication with feature size of less than 7 nm, such as 5 nm.

Extreme ultraviolet (EUV) lithography is regarded as Savior technology because EUV can provide a light having a wavelength of 13.5 nm which can extend Moore's law for at least 10 years. However, when EUV is actually applied to mass production for semiconductor manufacture, innumerable problems need to be overcome. The most difficult one is how to generate a stable light source with sufficient intensity; in addition, EUV lithography demands a rigorous standard for environmental cleanliness. Further, EUV lithography is expensive and consumes tremendous amount of electric power. Accordingly, IC production cost will rise sharply.

SUMMARY OF THE INVENTION

In view that the conventional manufacturing processes of forming circuit patterns have technical defects, an objective of the instant disclosure is to provide a method of making a circuit pattern, which has advantages of simplicity and cost-effectiveness, thereby being beneficial for mass production and having a high potential for commercial implementation.

To achieve the foresaid objective, the instant disclosure provides a method of making a circuit pattern, which includes Steps (A) to (F). Among the steps, a master mask is produced in Steps (A) to (C); then, the master mask obtained from the aforesaid steps is used to make the circuit pattern on a chip. In Step (A): a master substrate is provided. The master substrate comprises a transparent substrate and a first photosensitive layer formed on the transparent substrate; wherein the first photosensitive layer includes multiple photosensitive particles; the photosensitive particles of the first photosensitive layer comprise a first metal salt containing first metal ions, wherein the first metal ions comprise silver ions or chromium ions. In Step (B): a first energy beam is provided to irradiate the first photosensitive layer to reduce the first metal ions that are in a predetermined area of the first photosensitive layer, so as to form multiple atomized first metal particles; wherein the first energy beam has a wavelength ranging from 1 picometer (pm) to 200 nanometers (nm). In Step (C): unreduced photosensitive particles of the first photosensitive layer are removed by a first fixer to obtain a master mask; wherein the atomized first metal particles form a first predetermined pattern on the master mask. In Step (D): a chip is provided. The chip comprises a semiconductor substrate and a second photosensitive layer formed on the semiconductor substrate; wherein the second photosensitive layer includes multiple photosensitive particles; the photosensitive particles of the second photosensitive layer comprise a second metal salt containing second metal ions, wherein the second metal ions comprise silver ions or chromium ions. In Step (E): the master mask is disposed on the second photosensitive layer to form a complex layer, and then a second energy beam is provided to irradiate the complex layer to reduce the second metal ions that are in an area of the second photosensitive layer which is not covered by the first predetermined pattern of the master mask, so as to form multiple atomized second metal particles; wherein the second energy beam has a wavelength ranging from 1 pm to 200 nm. In Step (F): unreduced photosensitive particles of the second photosensitive layer are removed by a second fixer to obtain the circuit pattern. Wherein the circuit pattern has a second predetermined pattern formed by the atomized second metal particles; wherein the second predetermined pattern is a negative image of the first predetermined pattern, and a line spacing in the circuit pattern ranges from 1 pm to 100 nm.

In accordance with the instant disclosure, by absorbing the energy of the first energy beam having a wavelength at a picoscopic scale to a nanoscopic scale, multiple photosensitive particles located in the predetermined area of the master substrate are reduced to form multiple atomized first metal particles. Then, through the first fixing step to remove the unreduced photosensitive particles (i.e. those photosensitive particles not located in the predetermined area, which are not irradiated by the first energy beam to undergo a reduction reaction), the obtained master mask will have the first predetermined pattern arranged by the atomized first metal particles. Afterwards, the master mask is disposed onto a chip comprising a photosensitive layer, and the master mask performs a function equal to a photomask. Therefore, the photosensitive particles in the area, which is not covered by the first predetermined pattern of the master mask, can absorb the energy of the second energy beam to be reduced and form multiple atomized second metal particles. Then, the unreduced photosensitive particles are removed through the second fixing step. Since the part of the area of the second photosensitive layer which is covered by the first predetermined pattern of the master mask cannot absorb the energy of the second energy beam, photosensitive particles in the aforesaid area will be removed in the second fixing step, and the second predetermined pattern is finally obtained, that is, the second predetermined pattern is the pattern formed by the atomized second metal particles deposited on the semiconductor substrate. The second predetermined pattern is a negative image of the first predetermined pattern of the master mask. The line spacing in the circuit pattern ranges from 1 pm to 100 nm. Since the material of the second metal particles is metallic silver or metallic chromium, and both of which have a good electrical conductivity, the circuit pattern can provide a function of electrical conduction.

In accordance with the instant disclosure, since the first energy beam and the second energy beam respectively have the wavelength at a picoscopic scale to a nanoscopic scale, the phenomena of interference and diffraction caused by the similarity in size between the wavelength of light source and line spacing of photomask in the conventional manufacturing processes can be avoided when the photolithography technology is applied in the existing manufacture process. Moreover, costly EUV lithography is no longer needed in the instant disclosure; and the instant disclosure can make IC patterns with finer lines, thereby offering amazing development potentialities.

Preferably, the first energy beam can be connected to a controlling component such as a computer system. Therefore, the controlling component may operate the first energy beam to directly depict a desired IC pattern onto the first photosensitive layer without any traditional photomask. That is, the desired IC pattern depicted onto the first photosensitive layer is the predetermined area of Step (B). Compared to the traditional photomask, which needs to be produced by a series of complicated steps comprising metal sputtering, photoresist coating, e-beam lithography, chemical developing, etching and photoresist stripping in sequence, the process for making the master mask in Steps (A) to (C) of the instant disclosure is much simpler, so the required time from pattern design to completion in the IC circuit pattern manufacture will be significantly shortened.

In accordance with the instant disclosure, the first energy beam and the second energy beam independently may be an electron beam, an X-ray, or EUV, but it is not limited thereto. In certain embodiments, the first energy beam and the second energy beam have a same wavelength. In certain embodiments, the first energy beam and the second energy beam may respectively be an electron beam generated by an electron accelerator to have energy ranging from 0.1 kilovolts (kV) to 1000 kV, but it is not limited thereto. For other examples, the first energy beam and/or the second energy beam may be an ArF laser having a wavelength of 193 nm, a molecular fluorine ($F_2$) excimer laser having a wavelength of 157 nm, an EUV laser having a wavelength of 13.5 nm or an X-ray having a wavelength of 0.01 nm to 10 nm, but it is not limited thereto. In certain embodiments, in Step (B), the first energy beam may provide a total radiation dose ranging from 10 kilograys (kGy) to 600 kGy to reduce first metal ions in the photosensitive particles of the first photosensitive layer to form multiple atomized first metal particles. In certain embodiments, in Step (E), the second energy beam may provide a total radiation dose ranging from 10 kGy to 600 kGy to reduce second metal ions in those photosensitive particles located in the area in the second photosensitive layer, which is not covered by the first predetermined pattern, to form multiple atomized second metal particles.

Preferably, Steps (B) and (E) are independently carried out in an environment with a degree of vacuum of from $10^{-4}$ pascals (Pa) to $10^{-9}$ Pa.

Preferably, the first photosensitive layer has an average thickness in the range between larger than 1 nm and smaller than or equal to 150 nm, but it is not limited thereto. Specifically, the first photosensitive layer may have an average thickness of 1.5 nm, 2.0 nm, 5.0 nm, 7.0 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 90 nm, 100 nm, 110 nm, 120 nm or 130 nm. Preferably, the second photosensitive layer has an average thickness in the range between larger than 1 nm and smaller than or equal to 150 nm, but it is not limited thereto. Specifically, the second photosensitive layer may have an average thickness of 1.5 nm, 2.0 nm, 5.0 nm, 7.0 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 90 nm, 100 nm, 110 nm, 120 nm or 130 nm.

Preferably, the photosensitive particles of the first photosensitive layer have an average particle size ranging from 0.1 nm to 10 μm. More preferably, the photosensitive particles of the first photosensitive layer have an average particle size ranging from 0.1 nm to 100 nm. Even more preferably, the photosensitive particles of the first photosensitive layer have an average particle size ranging from 0.1 nm to 10 nm. Preferably, the photosensitive particles of the second photosensitive layer have an average particle size ranging from 0.1 nm to 10 μm. More preferably, the photosensitive particles of the second photosensitive layer have an average particle size ranging from 0.1 nm to 100 nm. Even more preferably, the photosensitive particles of the second photosensitive layer have an average particle size ranging from 0.1 nm to 10 nm.

In accordance with the instant disclosure, the first metal salt of the first photosensitive layer and the second metal salt of the second photosensitive layer may be made of the same or different kinds of materials. Preferably, the first metal salt may be silver chloride (AgCl), silver bromide (AgBr), silver iodide (AgI), sodium dichromate ($Na_2Cr_2O_7$), ammonium dichromate (($NH_4$)$_2Cr_2O_7$) or a combination thereof. Preferably, the second metal salt may be AgCl, AgBr, AgI, $Na_2Cr_2O_7$, ($NH_4$)$_2Cr_2O_7$ or a combination thereof. Preferably, the photosensitive particles of the first and second photosensitive layers are made of the same kind of material. Preferably, both of the first metal salt of the first photosensitive layer and the second metal salt of the second photosensitive layer are AgBr.

In accordance with the instant disclosure, there are no specific limitations to the material of the transparent substrate as long as the second energy beam can directly pass through the transparent substrate. Preferably, the transparent substrate is made of optical glasses, but it is not limited thereto. Specifically, when the transparent substrate is made of lanthanum heavy flint glasses, the transparent substrate may have advantages of high refractivity, low dispersion, high rigidity and high wear resistance.

In accordance with the instant disclosure, the material of the semiconductor substrate may comprise a silicon-containing material or a carbon-containing material. For example, the carbon-containing material may be graphene, but it is not limited thereto.

In certain embodiments, at least one of the first and second photosensitive layers further comprises a photosensitizer. For example, the photosensitizer may comprise aldehydes or a sulfur-containing substance such as thiosulfates and silver sulfide nanoparticles, but it is not limited thereto. By adding the photosensitizer, some photosensitive centers will be formed on the crystal surfaces of the photosensitive particles; accordingly, the level of sensitivity of the metal ions will be enhanced and the reduction reaction will be accelerated.

In certain embodiments, Step (C) may comprise Steps (C1) and (C2). In Step (C1), among the photosensitive particles, those first metal ions irradiated by the first energy beam may be treated with a first developing agent to improve the reduction thereof to form the atomized first metal particles. In Step (C2), the unreduced photosensitive particles of the first photosensitive layer (i.e. substantively those photosensitive particles of the first photosensitive layer not located in the predetermined area) are removed by the first fixer to obtain the master mask.

In certain embodiments, Step (F) may comprise Steps (F1) and (F2). In Step (F1), among the photosensitive particles, those second metal ions irradiated by the second energy beam may be treated with a second developing agent to improve the reduction thereof to form the atomized second metal particles. In Step (F2), the unreduced photosensitive particles of the second photosensitive layer are removed by the second fixer to obtain the circuit pattern.

In accordance with the instant disclosure, the developing agent is a reducing agent. Therefore, by using the first or second developing agent, the photosensitive particles irradiated by the first or second energy beam will undergo a faster and more complete reduction reaction to become metallic silver or metallic chromium. Preferably, the duration of Step (C1) and/or the duration of Step (F1) may range from 0.1 minutes (min) to 15 min; more preferably, the duration of Step (C1) and/or the duration of Step (F1) may range from 1 min to 10 min.

Preferably, Step (C1) and/or Step (F1) may be conducted at a temperature ranging from 15° C. to 28° C.

Preferably, the first developing agent may comprise hydroquinone, 1-phenyl-3-pyrazolidinone (also called Phenidone), 4-methylaminophenol sulfate (also called Metol) or any combination thereof. Preferably, the second developing agent may comprise hydroquinone, 1-phenyl-3-pyrazolidinone, 4-methylaminophenol sulfate or any combination thereof. For the instant disclosure, the first and second developing agents may be the same or different. Preferably, the first and second developing agents are the same.

Preferably, the first developing agent may further comprise a pH adjusting agent. Preferably, the second developing agent may further comprise a pH adjusting agent. By adding the pH adjusting agent, Step (C1) and/or Step (F1) individually may be conducted in a basic environment. Preferably, the basic environment may have a pH value ranging from 8.5 to 10.5.

Preferably, between Steps (C1) and (C2), the method may add a rinsing step to prevent the remaining first developing agent influencing the subsequent work of the first fixer. In the aforesaid rinsing step, a flowing water or a weak acidic aqueous solution is respectively used to dilute or neutralize the remaining first developing agent on the first photosensitive layer which has been treated with the first developing agent. Similarly, between Steps (F1) and (F2), the method may add a rinsing step to prevent the remaining second developing agent influencing the subsequent work of the second fixer. In the aforesaid rinsing step, a flowing water or a weak acidic aqueous solution is respectively used to dilute or neutralize the remaining second developing agent on the second photosensitive layer which has been treated with the second developing agent. Preferably, the rinsing step may be followed by a drying step.

In accordance with the instant disclosure, in order to stabilize the pattern formed by the metal particles after the developing step, the fixer is used to solve and then remove the unreduced photosensitive particles (i.e. unexposed photosensitive particles). Preferably, the reaction time of the first fixer in Step (C2) and/or the reaction time of the second fixer in Step (F2) may range from 1 min to 5 min, but it is not limited thereto.

Preferably, Step (C2) and/or Step (F2) may have a pH value ranging from 4 to 8.

Preferably, the first fixer may comprise sodium thiosulfate (also known as "hypo") or ammonium thiosulfate. Preferably, the second fixer may comprise sodium thiosulfate or ammonium thiosulfate.

Preferably, after the first fixer stops working in Step (C2), the method may add a rinsing step to remove the remaining first fixer to prevent the first predetermined pattern of the master mask being corroded by the first fixer. Similarly, preferably, after the second fixer stops working in Step (F2), the method may add a rinsing step to remove the remaining second fixer to prevent the second predetermined pattern of the obtained circuit pattern being corroded by the second fixer. Preferably, the rinsing step may be followed by a drying step.

In accordance with the instant disclosure, there are no specific limitations to the way how to dispose the master mask on the second photosensitive layer. Preferably, the master mask may be directly stacked on the second photosensitive layer. More preferably, the master mask may be put with the first predetermined pattern facing upward; that is, the transparent substrate of the master mask will contact the chip, and the first predetermined pattern will not contact the chip. Thus, the first predetermined pattern of the master mask can be reused since it is not to be damaged easily.

In accordance with the instant disclosure, after patterning in Step (F), the chip with the circuit pattern is obtained and can be used as another semiconductor substrate in Step (D) of the method of making a circuit pattern of the instant disclosure.

Other objectives, advantages and novel features of the disclosure will become more apparent from the following detailed description when taken in conjunction with the accompanying drawings.

BRIEF DESCRIPTION OF THE DRAWINGS

FIGS. 1A and 1B are schematic flow diagrams illustrating a method of making a circuit pattern in accordance with the instant disclosure.

DETAILED DESCRIPTION OF THE PREFERRED EMBODIMENTS

Hereinafter, one skilled in the arts can easily realize the advantages and effects of the instant disclosure from the following examples. Therefore, it should be understood that the descriptions proposed herein are just preferable examples for the purpose of illustrations only, not intended to limit the scope of the disclosure. Various modifications and variations could be made in order to practice or apply the instant disclosure without departing from the spirit and scope of the disclosure.

EXAMPLE 1

Method of Making a Circuit Pattern at a Nanoscopic Scale

Preparing a Master Mask
First, a master substrate was provided. The master substrate comprised a transparent substrate and a first photosensitive layer formed on the transparent substrate; wherein the first photosensitive layer included multiple photosensitive particles; the photosensitive particles of the first photosensitive layer comprised AgBr particles as the first metal salt containing silver ions. The first photosensitive layer had an average thickness of about 70 nm, and the average particle size of the AgBr particles of the first photosensitive layer was about 50 nm.

Then, under an environment with a vacuum degree of $10^{-4}$ Pa, a first energy beam connecting with a computer system was provided. The computer system operated the emission of the first energy beam, so the first energy beam could directly depict a negative image of a desired IC pattern onto the first photosensitive layer. Accordingly, AgBr particles in the area of the first photosensitive layer consistent with the negative image of the desired IC pattern would be reduced to form black metallic silver particles by absorbing the energy of the first energy beam; wherein the first energy beam was an ArF laser having a wavelength of 193 nm.

Subsequently, a first developing agent contacted the first photosensitive layer at a temperature of 18° C., and the silver ions of the AgBr particles irradiated by the first energy beam were reduced completely to form silver particles in the first photosensitive layer. The first developing agent comprised 1-phenyl-3-pyrazolidinone and a pH adjusting agent.

Next, a flowing double-distilled water (ddH$_2$O) was used to carefully rinse the first photosensitive layer which was treated with the first developing agent, and then the first fixer was used to remove unreduced AgBr particles in the first photosensitive layer; wherein the first fixer was sodium thiosulfate. Afterward, a flowing ddH$_2$O was used to carefully rinse the first photosensitive layer which was treated with the first fixer, and this rinsing step was repeated three times and then was followed by a drying step, and finally a master mask was obtained. The master mask had a first predetermined pattern formed by the silver particles, and the first predetermined pattern was the negative image of the desired IC pattern.

Preparing a Circuit Pattern at a Nanoscopic Scale

First, a chip was provided. The chip comprised a silicon substrate and a second photosensitive layer formed on the silicon substrate; wherein the second photosensitive layer included multiple photosensitive particles; the photosensitive particles of the second photosensitive layer comprised AgBr particles as the second metal salt containing silver ions. The second photosensitive layer had an average thickness of about 70 nm, and the average particle size of the AgBr particles of the second photosensitive layer was the same as the average particle size of the AgBr particles of the first photosensitive layer.

Then, under an environment with the same vacuum degree of $10^{-4}$ Pa, the aforesaid master mask was directly stacked on the second photosensitive layer to form a complex layer. Then, a second energy beam connecting with a computer system was provided to irradiate the complex layer. Silver ions of the AgBr particles in an area of the second photosensitive layer which were not covered by the first predetermined pattern of the master mask were reduced to form black metallic silver particles by absorbing the energy of the second energy beam; wherein the second energy beam was an ArF laser having a wavelength of 193 nm.

Subsequently, a second developing agent contacted the second photosensitive layer at a temperature of 18° C., and the silver ions of the AgBr particles irradiated by the second energy beam were reduced completely to form silver particles in the second photosensitive layer. The second developing agent comprised 1-phenyl-3-pyrazolidinone and a pH adjusting agent.

Next, a flowing ddH$_2$O was used to carefully rinse the second photosensitive layer which was treated with the second developing agent, and then the second fixer was used to remove unreduced AgBr particles in the second photosensitive layer; wherein the second fixer was sodium thiosulfate. Afterward, a flowing ddH$_2$O was used to carefully rinse the second photosensitive layer which was treated with the second fixer, and this rinsing step was repeated three times and then was followed by a drying step, and finally a circuit pattern having a second predetermined pattern was obtained. The second predetermined pattern of the circuit pattern was a negative image of the first predetermined pattern of the master mask, and spaces between lines of the second predetermined pattern in the circuit pattern (also called "line spacing") were determined by the positions of the lines formed by the silver particles of the master mask. That is, the second predetermined pattern of the circuit pattern was the desired IC pattern; wherein the line spacing of the circuit pattern was at a nanoscopic scale.

EXAMPLE 2

Method of Making a Circuit Pattern at a Picoscopic Scale

Preparing a Master Mask

First, a master substrate was provided. The master substrate comprised a transparent substrate and a first photosensitive layer formed on the transparent substrate; wherein the first photosensitive layer included multiple photosensitive particles; the photosensitive particles of the first photosensitive layer comprised AgBr particles as the first metal salt containing silver ions. The first photosensitive layer had an average thickness of about 50 nm, and the average particle size of the AgBr particles of the first photosensitive layer was about 5 nm.

Then, under an environment with a vacuum degree of $10^{-7}$ Pa, a first energy beam connecting with a computer system was provided. The computer system operated the emission of the first energy beam, so the first energy beam could directly depict a negative image of a desired IC pattern onto the first photosensitive layer. Accordingly, AgBr particles in the area of the first photosensitive layer consistent with the negative image of the desired IC pattern would reduce to form black metallic silver particles by absorbing the energy of the first energy beam; wherein the first energy beam was an X-ray having a wavelength of 0.1 nm.

Subsequently, a first developing agent contacted the first photosensitive layer at a temperature of 18° C., and the silver ions of the AgBr particles irradiated by the first energy beam were reduced completely to form multiple atomized silver particles in the first photosensitive layer. The first developing agent comprised 1-phenyl-3-pyrazolidinone and a pH adjusting agent.

Next, a flowing ddH$_2$O was used to carefully rinse the first photosensitive layer which was treated with the first developing agent, and then the first fixer was used to remove unreduced AgBr particles in the first photosensitive layer; wherein the first fixer was sodium thiosulfate. Afterward, a flowing ddH$_2$O was used to carefully rinse the first photosensitive layer which was treated with the first fixer, and this rinsing step was repeated three times and then was followed by a drying step, and finally a master mask having a first predetermined pattern was obtained. In the master mask, the atomized silver particles formed the first predetermined pattern, which was the negative image of the desired IC pattern.

Preparing a Circuit Pattern at a Picoscopic Scale

First, a chip was provided. The chip comprised a silicon substrate and a second photosensitive layer formed on the silicon substrate; wherein the second photosensitive layer included multiple photosensitive particles; the photosensitive particles of the second photosensitive layer comprised AgBr particles as the second metal salt containing silver ions. The second photosensitive layer had an average thickness of about 50 nm, and the average particle size of the AgBr particles of the second photosensitive layer was the same as the average particle size of the AgBr particles of the first photosensitive layer.

Then, under an environment with the same vacuum degree of $10^{-7}$ Pa, the aforesaid master mask was directly stacked on the second photosensitive layer to form a complex layer. Then, a second energy beam connecting with a computer system was provided to irradiate the complex layer. Silver ions of the AgBr particles in an area of the second photosensitive layer which were not covered by the first predetermined pattern of the master mask were reduced to form black metallic silver particles by absorbing the energy of the second energy beam; wherein the second energy beam was an X-ray having a wavelength of 0.1 nm.

Subsequently, a second developing agent contacted the second photosensitive layer at a temperature of 18° C., and the silver ions of the AgBr particles irradiated by the second energy beam were reduced completely to form atomized silver particles in the second photosensitive layer. The second developing agent comprised 1-phenyl-3-pyrazolidinone and a pH adjusting agent.

Next, a flowing ddH$_2$O was used to carefully rinse the second photosensitive layer which was treated with the second developing agent, and then the second fixer was used to remove unreduced AgBr particles in the second photosensitive layer; wherein the second fixer was sodium thiosulfate. Afterward, a flowing ddH$_2$O was used to carefully rinse the second photosensitive layer which was treated with the second fixer, and this rinsing step was repeated three times and then was followed by a drying step, and finally a circuit pattern having a second predetermined pattern was obtained. The second predetermined pattern of the circuit pattern was a negative image of the first predetermined pattern of the master mask, and the line spacing of the second predetermined pattern in the circuit pattern indicated the position of the lines formed by the atomized silver particles of the master mask. That is, the second predetermined pattern of the circuit pattern was the desired IC pattern; wherein the line spacing was at a picoscopic scale.

From the methods of making a circuit pattern disclosed in Examples 1 and 2, it demonstrates that circuit patterns having various line spacings at different dimension scales can be obtained in the instant disclosure by adopting any energy beams having different wavelengths with any photosensitive particles having different particle sizes. Therefore, the instant disclosure can be applied to make circuit patterns at various size scales in a simple, widely applicable and effective manner. Consequently, the instant disclosure can be more easily to be applied to manufacture of various electronic products.

In conclusion, the method of making a circuit pattern of the instant disclosure indeed can form ultra-fine circuit patterns which can be applied to the IC field in a simple and cost-effective way. Accordingly, the instant disclosure has a high potential for commercial implementation.

Even though numerous characteristics and advantages of the instant disclosure have been set forth in the foregoing description, together with details of the structure and features of the disclosure, the disclosure is illustrative only. Changes may be made in the details, especially in matters of shape, size, and arrangement of parts within the principles of the disclosure to the full extent indicated by the broad general meaning of the terms in which the appended claims are expressed.

What is claimed is:

1. A method of making a circuit pattern, comprising steps of:
   Step (A): providing a master substrate which comprises a transparent substrate and a first photosensitive layer formed on the transparent substrate; wherein the first photosensitive layer includes multiple photosensitive particles; the photosensitive particles of the first photosensitive layer comprise a first metal salt containing first metal ions, wherein the first metal ions comprise chromium ions;
   Step (B): providing a first energy beam to irradiate the first photosensitive layer to reduce the first metal ions that are in a predetermined area of the first photosensitive layer, so as to form multiple atomized first metal particles; wherein the first energy beam has a wavelength ranging from 1 picometer to 200 nanometers;
   Step (C): removing unreduced photosensitive particles of the first photosensitive layer by a first fixer to obtain a master mask; wherein the atomized first metal particles form a first predetermined pattern on the master mask;
   Step (D): providing a chip which comprises a semiconductor substrate and a second photosensitive layer formed on the semiconductor substrate; wherein the second photosensitive layer includes multiple photosensitive particles; the photosensitive particles of the second photosensitive layer comprise a second metal salt containing second metal ions, wherein the second metal ions comprise chromium ions;
   Step (E): disposing the master mask on the second photosensitive layer to form a complex layer, and then providing a second energy beam to irradiate the complex layer to reduce the second metal ions that are in an area of the second photosensitive layer which is not covered by the first predetermined pattern of the master mask, so as to form multiple atomized second metal particles; wherein the second energy beam has a wavelength ranging from 1 picometer to 200 nanometers; and
   Step (F): removing unreduced photosensitive particles of the second photosensitive layer by a second fixer to obtain the circuit pattern; wherein the circuit pattern has a second predetermined pattern formed by the atomized second metal particles; wherein the second predetermined pattern is a negative image of the first predetermined pattern, and a line spacing in the circuit pattern ranges from 1 picometer to 100 nanometers.

2. The method as claimed in claim 1, wherein a total radiation dose provided by the first energy beam ranges from 10 kilograys to 600 kilograys.

3. The method as claimed in claim 2, wherein the first metal salt is sodium dichromate, ammonium dichromate or a combination thereof.

4. The method as claimed in claim 1, wherein a total radiation dose provided by the second energy beam ranges from 10 kilograys to 600 kilograys.

5. The method as claimed in claim 4, wherein the second metal salt is sodium dichromate, ammonium dichromate or a combination thereof.

6. The method as claimed in claim 1, wherein the first fixer comprises sodium thiosulfate or ammonium thiosulfate.

7. The method as claimed in claim 6, wherein at least one of the first and second photosensitive layers further comprises a photosensitizer.

8. The method as claimed in claim 1, wherein at least one of the first and second photosensitive layers further comprises a photosensitizer.

9. The method as claimed in claim 8, wherein the photosensitive particles of the first photosensitive layer have an average particle size ranging from 0.1 nm to 10 µm.

10. The method as claimed in claim 1, wherein the photosensitive particles of the first photosensitive layer have an average particle size ranging from 0.1 nm to 10 µm.

11. The method as claimed in claim 1, wherein the first metal salt is sodium dichromate, ammonium dichromate or a combination thereof.

12. The method as claimed in claim 1, wherein the second metal salt is sodium dichromate, ammonium dichromate or a combination thereof.

13. The method as claimed in claim 1, wherein Step (C) comprises:
    Step (C1): treating the first metal ions irradiated by the first energy beam with a first developing agent to form the atomized first metal particles; and
    Step (C2): removing the unreduced photosensitive particles of the first photosensitive layer by the first fixer to obtain the master mask.

14. The method as claimed in claim 13, wherein Step (F) comprises:
    Step (F1): treating the second metal ions irradiated by the second energy beam with a second developing agent to form the atomized second metal particles; and
    Step (F2): removing the unreduced photosensitive particles of the second photosensitive layer by the second fixer to obtain the circuit pattern.

15. The method as claimed in claim 13, wherein the first developing agent comprises hydroquinone, 1-phenyl-3-pyrazolidinone, 4-methylaminophenol sulfate or any combination thereof.

16. The method as claimed in claim 15, wherein the first developing agent further comprises a pH adjusting agent.

\* \* \* \* \*